US00RE45771E

(19) United States
(12) Reissued Patent
Sprouse et al.

(10) Patent Number: US RE45,771 E
(45) Date of Reissued Patent: Oct. 20, 2015

(54) OPTIMIZED PAGE PROGRAMMING ORDER FOR NON-VOLATILE MEMORY

(71) Applicant: SanDisk Technologies Inc., Plano, TX (US)

(72) Inventors: Steven Sprouse, San Jose, CA (US); Jianmin Huang, Sunnyvale, CA (US); Chris Avila, Sunnyvale, CA (US); Yichao Huang, San Jose, CA (US); Emilio Yero, Sunnyvale, CA (US)

(73) Assignee: SanDisk Technologies Inc., Plano, TX (US)

(21) Appl. No.: 14/285,833

(22) Filed: May 23, 2014

Related U.S. Patent Documents

Reissue of:

(64) Patent No.: 8,180,994
Issued: May 15, 2012
Appl. No.: 12/499,219
Filed: Jul. 8, 2009

(51) Int. Cl.
*G06F 12/00* (2006.01)
*G11C 11/56* (2006.01)

(52) U.S. Cl.
CPC .... *G11C 11/5628* (2013.01); *G11C 2211/5648* (2013.01)

(58) Field of Classification Search
CPC ..... G11C 11/5628; G11C 2211/5648
USPC ..... 711/102–103, 157, 202, 209, 213, 711/E12.001, E12.008; 365/230.01, 365/230.03, 230.04
See application file for complete search history.

(56) References Cited

U.S. PATENT DOCUMENTS 5,581,498 A * 12/1996 Ludwig et al. ..... 365/63
6,365,966 B1 * 4/2002 Chen et al. ..... 257/723
6,593,645 B2 * 7/2003 Shih et al. ..... 257/686
7,120,051 B2 * 10/2006 Gorobets et al. ..... 365/185.02
7,386,655 B2 * 6/2008 Gorobets et al. ..... 711/103
7,463,521 B2 12/2008 Li
7,502,260 B2 3/2009 Li (Continued)

FOREIGN PATENT DOCUMENTS

TW 200929222 A 7/2009
TW 200929230 A 7/2009

(Continued)

OTHER PUBLICATIONS

Taiwan Office Action dated Nov. 21, 2014, Taiwanese Patent Application No. 099121097.

(Continued)

*Primary Examiner* — Hetul Patel
(74) *Attorney, Agent, or Firm* — Vierra Magen Marcus LLP

(57) ABSTRACT

During a programming data transfer process in a non-volatile storage system, recording units of data are transferred from a host to a memory device, such as a memory card. For each recording unit, pages of data are arranged in an order such that a page which takes longer to write to a memory array of the memory device is provided before a page which takes less time to write. Overall programming time for the recording unit is reduced since a greater degree of parallel processing occurs. While the page which takes longer to program is being programmed to the memory array, the page which takes less time to program is being transferred to the memory device. After programming is completed, the memory device signals the host to transfer a next recording unit. The pages of data may include lower, middle and upper pages.

22 Claims, 11 Drawing Sheets

(56) References Cited

U.S. PATENT DOCUMENTS

| | | | | |
|---|---|---|---|---|
| 7,577,036 | B2 * | 8/2009 | Sarin et al. | 365/185.2 |
| 7,941,591 | B2 * | 5/2011 | Aviles | 711/103 |
| 8,180,994 | B2 | 5/2012 | Sprouse et al. | |
| 2005/0223158 | A1 * | 10/2005 | See et al. | 711/103 |
| 2006/0221683 | A1 | 10/2006 | Chen et al. | |
| 2007/0002626 | A1 | 1/2007 | Li | |
| 2007/0174578 | A1 * | 7/2007 | Oshima | 711/170 |
| 2007/0245098 | A1 | 10/2007 | Takada | |
| 2008/0065823 | A1 * | 3/2008 | Khouri et al. | 711/109 |
| 2008/0205148 | A1 | 8/2008 | Kanda | |
| 2008/0219059 | A1 | 9/2008 | Li | |
| 2008/0250194 | A1 | 10/2008 | Chen | |
| 2009/0010063 | A1 | 1/2009 | Shiga | |
| 2009/0037652 | A1 | 2/2009 | Yu et al. | |
| 2010/0039858 | A1 * | 2/2010 | MacCarrone et al. | 365/185.03 |

FOREIGN PATENT DOCUMENTS

| | | | |
|---|---|---|---|
| WO | 2008099958 | A1 | 8/2008 |
| WO | WO2008099958 | A1 | 8/2008 |

OTHER PUBLICATIONS

English Abstract of Taiwanese Publication No. TW200929222 published on Jul. 1, 2009.

English Abstract of Taiwanese Publication No. TW200929230 published on Jul. 1, 2009.

Response to Office Action dated Feb. 17, 2015, Taiwanese Patent Application No. 099121097.

English translation of Replacement Specification and Replacement Claims filed in Response to Office Action dated Feb. 17, 2015, Taiwanese Patent Application No. 099121097.

SD Specifications—Part 1 Physical Layer Simplified Specification, Version 2.00, SD Group and SD Card Association, Sep. 25, 2006.

International Preliminary Report on Patentability dated Feb. 13, 2014 International Application No. PCT/US2010/037843 filed Jun. 8, 2010.

Chinese Office Action dated Feb. 24, 2014, Chinese Patent Application No. 201080030581.3.

Japanese Office Action dated Jun. 25, 2013, Japanese Patent Application No. JP2012-519556.

Response to Office Action dated Sep. 11, 2013, Japanese Patent Application No. JP2012-519556.

English translation of amended claims filed in Response to Office Action dated Sep. 11, 2013, Japanese Patent Application No. JP2012-519556.

Chinese Office Action dated Sep. 2, 2014, Chinese Patent Application No. 201080030581.3.

Response to Office Action dated Nov. 14, 2014, Chinese Patent Application No. 201080030581.3.

English translation of Amended Claims in Response to Office Action dated Nov. 14, 2014, Chinese Patent Application No. 201080030581.3.

International Search Report and the Written Opinion, dated Oct. 4, 2010, International Appln. No. PCT/US2010/037843 filed Jun. 8, 2010.

Memory Cards—Main Features and Benefits, 2008 SanDisk Corporation.

SD Specifications—Part 1 Physical Layer Simplified Specification, Version 2.00, SD Groug and SD Card Association, Sep. 25, 2006.

SD Specifiations—Part E1 SDIO Simplified Specification, Version 2.00, Technical Committee and SD Card Association, Feb. 8, 2007.

International Preliminary Report on Patentability dated Jan. 10, 2012, International Application No. PCT/US2010/037843 filed Jun. 8, 2010.

* cited by examiner

400
E
$V_{TH}$
1
0

400
E
x1
402
x0
Vv1
$V_{TH}$
1
0
0
1

400
E
11
404
A
01
406
B
00
408
C
10
Vra
Vva
Vrb
Vvb
Vrc
Vvc
$V_{TH}$

500
E
$V_{TH}$
1
0

500
E
xx1
502
xx0
Vv1
$V_{TH}$
1
0
0
1

500
E
x11
504
x01
506
x00
508
x10
Vv2
Vv3
Vv4
$V_{TH}$
1
0
0
1
1
0
0
1

500
E
111
510
A
011
512
B
001
514
C
101
516
D
100
518
E
000
520
F
010
522
G
110
Vva
Vvb
Vvc
Vvd
Vve
Vvf
Vvg
Vra
Vrb
Vrc
Vrd
Vre
Vrf
Vrg
$V_{TH}$

OPTIMIZED PAGE PROGRAMMING ORDER FOR NON-VOLATILE MEMORY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

Technology for data storage is discussed herein.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory such as NAND memory are among the most popular non-volatile semiconductor memories.

A memory device can be in the form of a card or other component which can be inserted into or otherwise connected to a host/user device, such as a host cell phone, digital camera or other device. Examples of memory devices with removable media formats are marketed under various trade names including COMPACTFLASH, SMARTMEDIA, SECURE DIGITAL, MEMORY STICK and XD-PICTURE CARD. A new generation of memory card formats with small form factors are sold under trade names including RS-MMC, MINISD AND MICROSD, AND INTELLIGENT STICK. In other cases, the memory device is permanently installed into the host device.

Write performance is always a concern with such memory devices. For example, the SD Association, an industry standards body, specifies speed classes with minimum host-to-memory device transfer speeds of 2, 4 and 6 MB/sec. Techniques are needed for increasing write performance in a memory device to meet and exceed performance goals.

The above and other issues by providing a method and non-volatile storage system in which write performance is increased.

BRIEF DESCRIPTION OF THE DRAWINGS

FIG. 7b depicts programming of different word lines based on the transmission and programming order of FIG. 7a.

DETAILED DESCRIPTION

A method and non-volatile storage system are provided in which write performance is increased.

In transferring data to be programmed from a host to a memory device, programming time can be decreased by transmitting logical pages of a data in a specific order. In particular, in multi-level memory devices, two, three or more bits are stored in each storage element according to logical pages of data. Data can be transferred in units of two or more logical pages, where the logical pages which take longer to program are provided before logical pages which take less time to program. For example, a middle page takes longer to program than a lower page, and an upper page takes longer to program than a middle page. For a given word line, the logical pages are programmed in the order of lower page, upper page, assuming there are two pages, or lower page, middle page, upper page, assuming there are three pages. However, it is not necessary to program one word line entirely with all logical pages before programming another word line. That is, a back and forth programming technique may be used in which a given word line is programmed with one page of data, after which one or more other word lines are programmed before returning to the given word line to continue programming it with another page of data. Overall programming time is reduced since a greater degree of parallel processing occurs.

Figure 1:
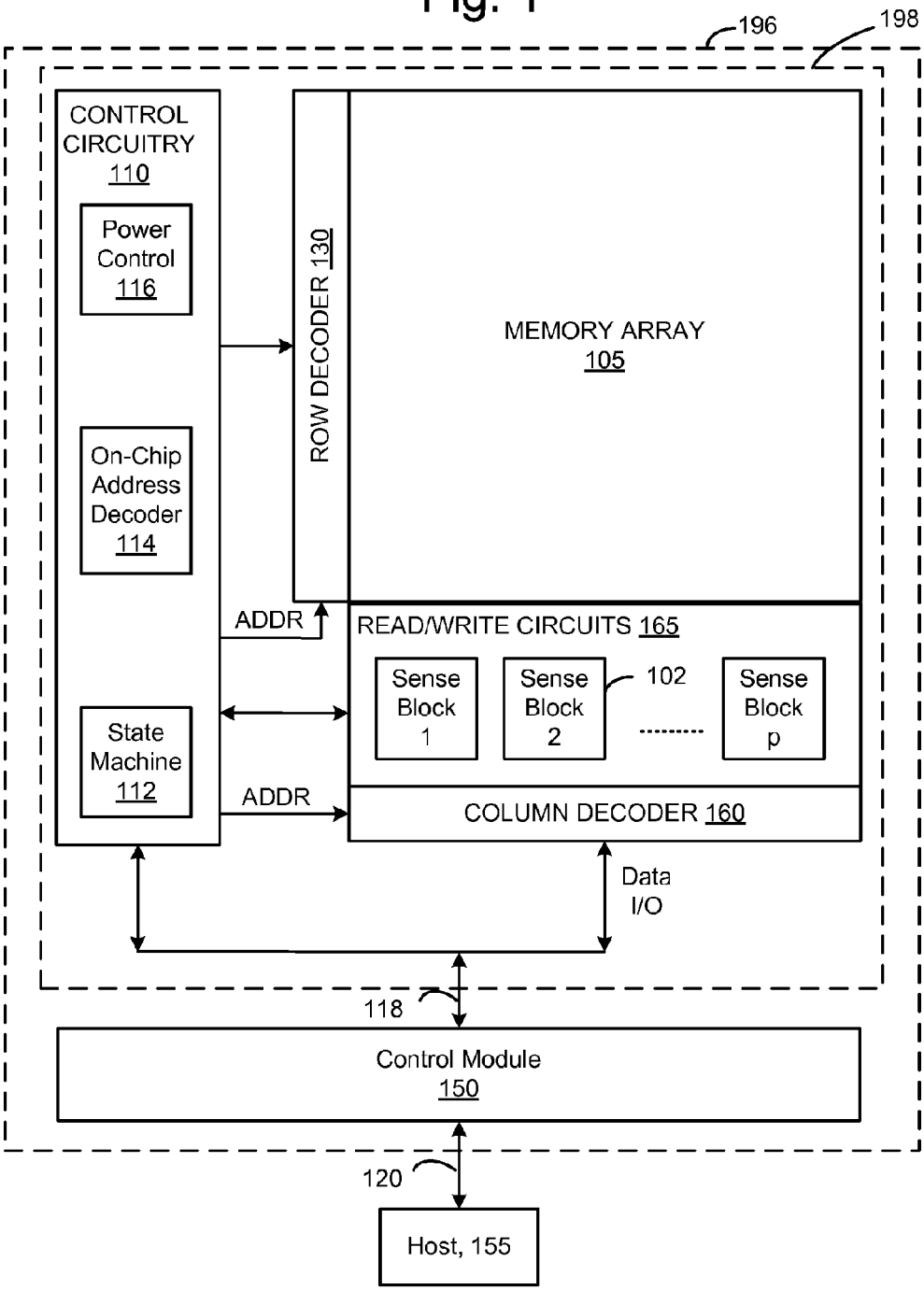
FIG. 1 is a block diagram of a non-volatile memory system using single row/column decoders and read/write circuits.

FIG. 1 provides one possible example of a non-volatile storage system which may be used. In particular, FIG. 1 is a block diagram of a non-volatile memory system using single row/column decoders and read/write circuits. The non-volatile memory system may include a memory device 196, such as a removable storage card, and a host 155. The memory device 196 has read/write circuits for reading and programming a page of storage elements in parallel, and may include one or more memory die 198. Memory die 198 includes a two-dimensional array of storage elements 105, control circuitry 110, and read/write circuits 165. In some embodiments, the array of storage elements can be three dimensional. For example, a device such as a secure digital (SD) memory card can have several stacked chips.

The memory array 105 is addressable by word lines via a row decoder 130 and by bit lines via a column decoder 160. The read/write circuits 165 include multiple sense blocks 102 and allow a page of storage elements to be read or programmed in parallel. Typically a control module 150 is included in the same memory device 196 as the one or more memory die 198. Commands and Data are transferred between the host 155 and control module 150 via lines 120 and between the control module 150 and the one or more memory die 198 via lines 118.

The control circuitry 110 cooperates with the read/write circuits 165 to perform memory operations on the memory array 105. The control circuitry 110 includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than storage element array 105, can be thought of as a managing or control circuit. For example, one or more managing or control circuits may include any one of or a combination of control circuitry 110, state machine 112, decoders 114/160, power control 116, sense blocks 102, read/write circuits 165, control module 150, etc.

In another embodiment, a non-volatile memory system uses dual row/column decoders and read/write circuits. Access to the memory array 105 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 105. In this way, the density of the read/write modules is reduced by one half.

Figure 2A:
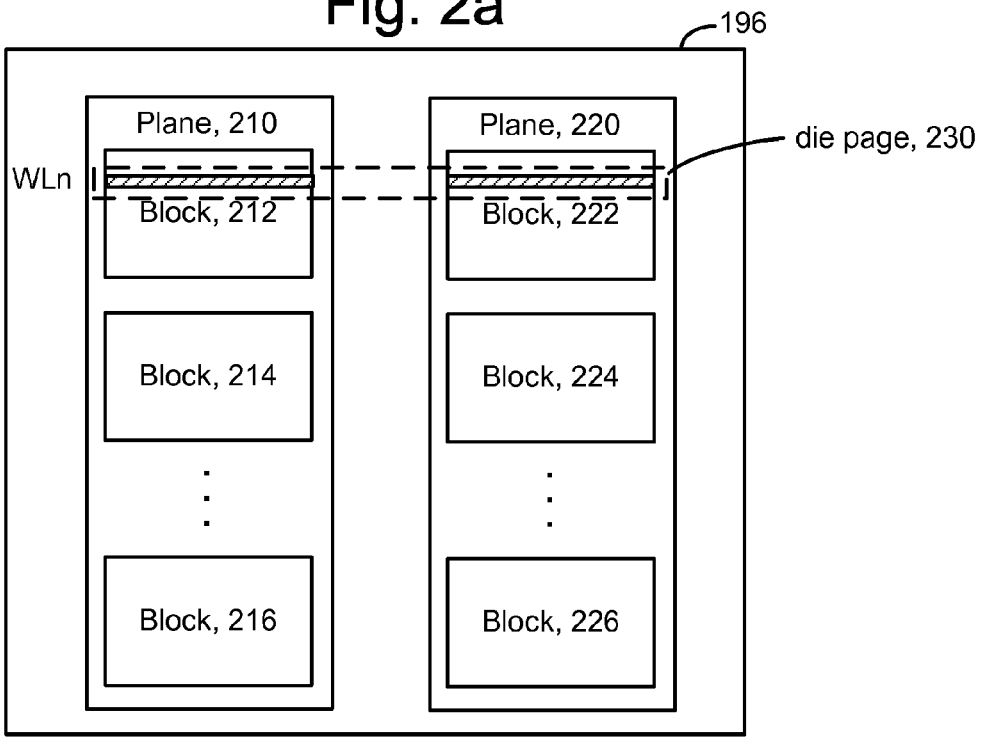
FIG. 2a depicts planes and blocks in a non-volatile storage system, and one example of a die page.

FIG. 2a depicts planes and blocks in a non-volatile storage system. A memory device chip typically includes many arrays of storage elements arranged in planes and block, in one possible implementation. The storage elements can be considered to be arranged in a hierarchy, where the chip level represents the highest level and the plane, block and/or page levels represent successively lower levels. A chip may include a memory module, a plane may include multiple blocks, a block may include a set of non-volatile storage elements in communication with a set of word lines, and a page may include non-volatile storage elements associated with a given word line, in one possible approach. As an example, a plane 210 includes blocks 212, 214, 216, and a plane 220 includes blocks 222, 224, . . . , 226.

Furthermore, in programming data to the storage elements, the data can be programmed in parallel across both planes, one block in each plane. In this process, a single die page is programmed at a time. A die page includes respective word lines of two blocks in different planes, for instance. For instance, a die page 230 may include storage elements of an nth word line, WLn, in block 212, as well as storage elements of WLn in block 222. Thus, the storage elements are on the same number word line in blocks which are in corresponding positions in their respective planes. For example, blocks 212 and 222 are the first blocks in planes 210 and 220, respectively. Thus programming of WLn in block 212 and WLn in block 222 can occur in parallel.

Figure 2B:
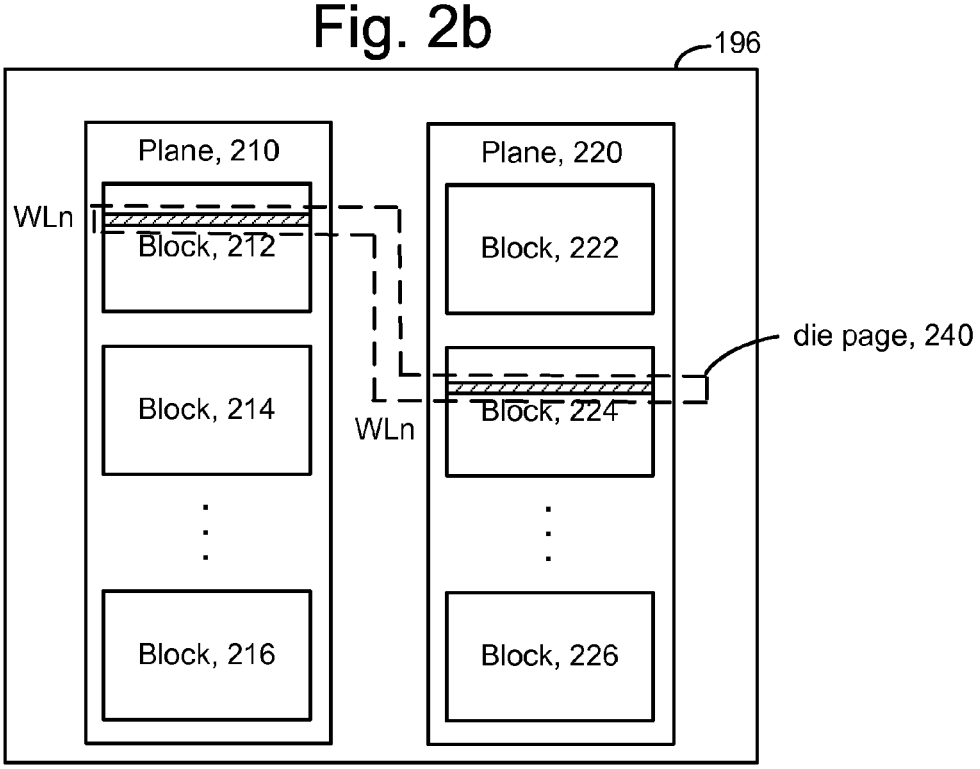
FIG. 2b depicts planes and blocks in a non-volatile storage system, and another example of a die page.

In another possible approach, depicted in FIG. 2b, the storage elements of a die page are on the same number word line in blocks which are in different positions in their respective planes. FIG. 2b depicts planes and blocks in a non-volatile storage system, and another example of a die page. For example, a die page 240 can includes storage elements on WLn of block 212, the first block in plane 210, and storage elements of WLn on block 224, the second block of plane 220. Thus programming of WLn in block 212 and WLn in block 224 can occur in parallel. Additionally, as discussed further below, the storage elements of a die page can store one or more logical pages of data. Thus, a logical page can also extend across two or more blocks in two or more planes.

Figure 3:
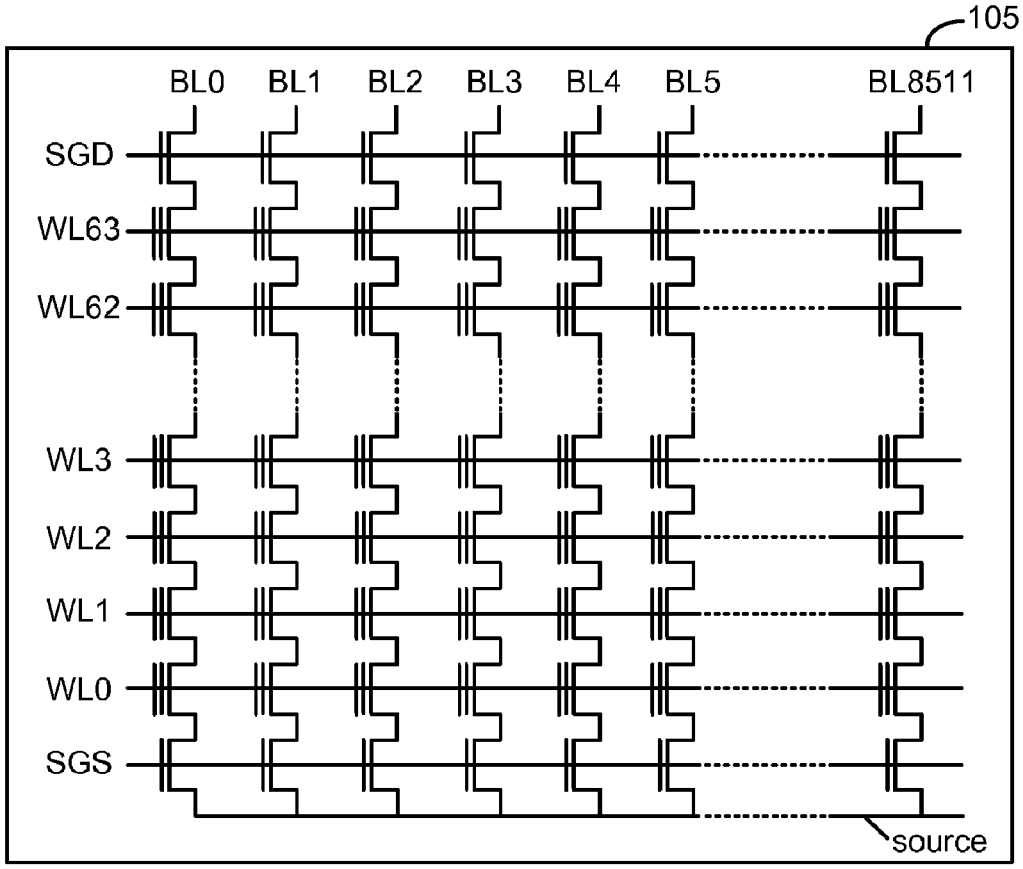
FIG. 3 illustrates an example of a memory array.

FIG. 3 illustrates an example of a memory array. In one example, a NAND flash EEPROM can be partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture, all the bit lines of a block can be simultaneously selected during read and program operations. Storage elements along a common word line and connected to any bit line can be programmed at the same time.

A number of storage elements (64 in this example) are connected in series to form a NAND string. One terminal of the NAND string is connected to a corresponding bit line via a drain select gate (connected to select gate drain line SGD), and another terminal is connected to c-source via a source select gate (connected to select gate source line SGS).

In another embodiment, referred to as an odd-even architecture, the bit lines are divided into even bit lines and odd bit lines, and storage elements along a common word line and connected to the odd bit lines are programmed at one time, while storage elements along a common word line and connected to even bit lines are programmed at another time.

Figures 4A, 4B, 4C:
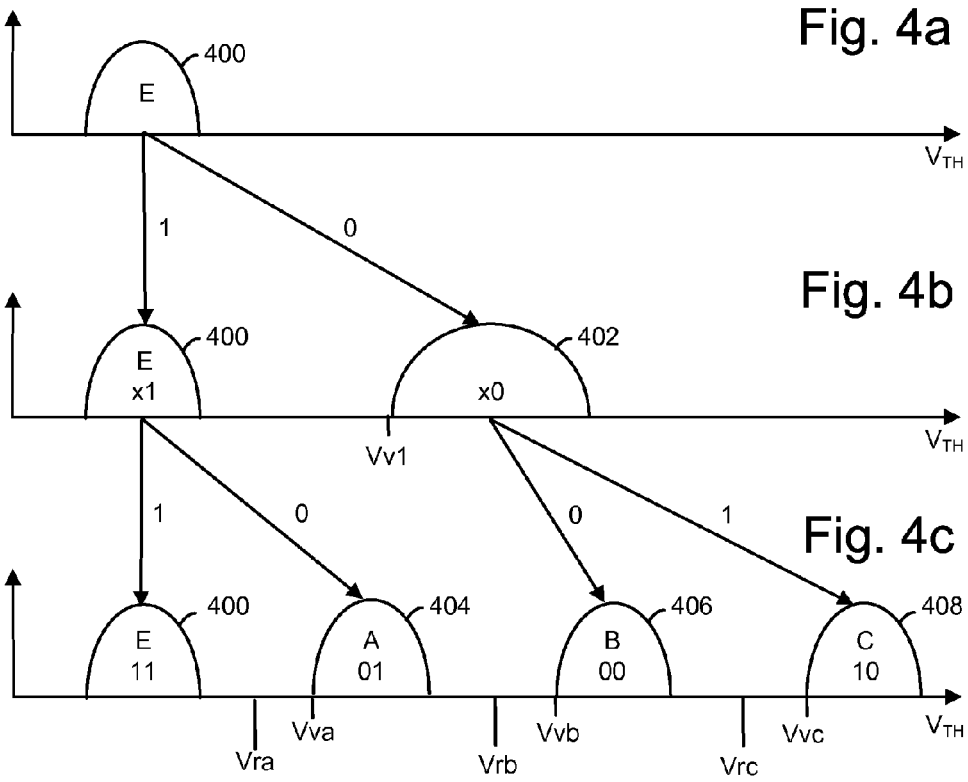
FIGS. 4a-c depict programming of lower and upper pages in two-bit, four-level storage elements.

FIGS. 4a-c depict programming of lower and upper pages in two-bit, four-level storage elements. Each graph depicts a threshold voltage VTH on the horizontal axis and a number or population of storage elements in a threshold voltage distribution on the vertical axis. In this case, each storage element can store two bits of data in one of four possible threshold voltage ranges, referred to as states E, A, B and C. Moreover, the bits are classified into lower and upper page data. Thus, a first bit of each storage element forms a lower page of data, and a second bit of each storage element forms an upper page of data.

Programming can be performed one logical page at a time, with the lower page followed by the upper page. Initially, all storage elements are in the erased (E) state, represented by the distribution 400 in FIG. 4a. FIG. 4b depicts programming of a lower page of data. If the lower page has a bit=1, the associated storage element remains in the distribution 400, and the data is represented by x1, where x is a bit that is not yet known. If the lower page has a bit=0, the storage element is programmed to a higher VTH as represented by distribution 402, which is a first interim distribution, using a verify level Vv1. The data of the these storage elements is represented by x0. Note that the interim distribution can be relatively wide since it is not a final distribution and does not represent a final data state.

FIG. 4c depicts programming of an upper page of data. If the upper page has a bit=1, the associated storage element in the distribution 400 remain in the distribution 400 and stores data bits 11, and the associated storage elements in the distribution 402 are programmed to the distribution 408, which is the C state, and store data bits 10. This programming uses a verify level Vvc. If the upper page has a bit=0, the associated storage elements in the distribution 400 are programmed to the distribution 404, which is the A state, and store data bits 01. This programming uses a verify level Vva. Similarly, the associated storage elements in the distribution 402 are programmed to the distribution 406, which is the B state, and store data bits 00. This programming uses a verify level Vvb. Read voltages Vra, Vrb and Vrc are also depicted.

Programming can be similarly extended to three or more bits per cell. For example, FIGS. 5a-d depict programming of lower, middle and upper pages in three-bit, eight-level storage elements. Initially, all storage elements are in the erased (E) state, represented by the distribution 500 in FIG. 5a. The lower page is programmed in FIG. 5b. If the lower page is bit=1, storage elements in distribution 500 remain in that distribution. If the lower page is bit=0, storage elements in distribution 500 are programmed to an interim distribution 502 using verify level Vv1. The middle page is programmed in FIG. 5c. If the middle page is bit=1, storage elements in distribution 500 remain in that distribution, and storage elements in distribution 502 are programmed to interim distribution 508 using verify level Vv4. If the middle page is bit=0, storage elements in distribution 500 are programmed to interim distribution 504 using verify level Vv2, and storage elements in distribution 502 are programmed to interim distribution 506 using verify level Vv3.

Figures 5A, 5B, 5C, 5D:
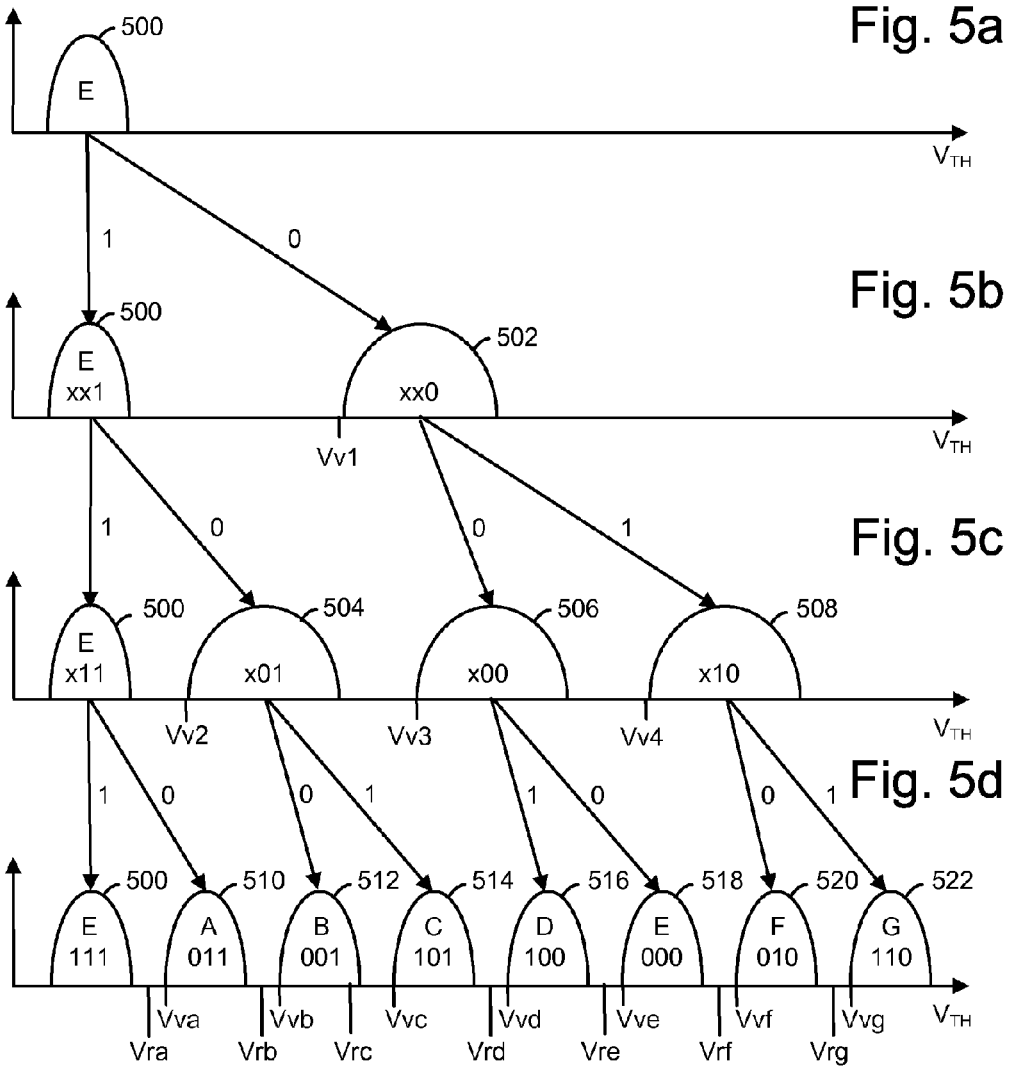
FIGS. 5a-d depict programming of lower, middle and upper pages in three-bit, eight-level storage elements.

The upper page is programmed in FIG. 5d. If the upper page is bit=1, storage elements in distribution 500 remain in that distribution, storage elements in distribution 504 are programmed to distribution 514 (state C) using verify level Vvc, storage elements in distribution 506 are programmed to distribution 516 (state D) using verify level Vvd, and storage elements in distribution 508 are programmed to distribution 522 (state G) using verify level Vvg. If the upper page is bit=0, storage elements in distribution 500 are programmed to distribution 510 (state A) using verify level Vva, storage elements in distribution 504 are programmed to distribution 512 (state B) using verify level Vvb, storage elements in distribution 506 are programmed to distribution 518 (state E) using verify level Vve, and storage elements in distribution 508 are programmed to distribution 520 (state F) using verify level Vvf. Read voltages Vra, Vrb, Vrc, Vrd, Vre, Vrf and Vrg are also depicted.

Programming using four bits per cell (16 levels) can similarly involve lower, lower-middle, upper-middle and upper pages.

Figure 6A:
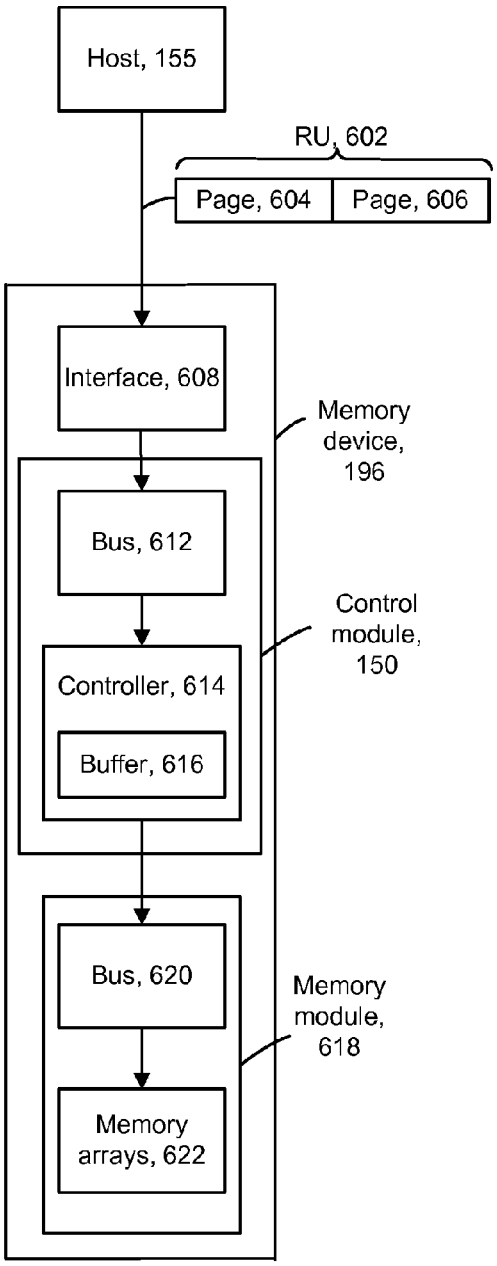
FIG. 6a depicts an example of a non-volatile storage system.

FIG. 6a depicts an example of a non-volatile storage system. A non-volatile storage system can include the memory device 196 of FIG. 1 which communicates with the host 155. The memory device can be a removable card or built in to an electronic device such as a cell phone or digital camera. The memory device 196 includes an interface 608 to the host, the control module 150 and a memory module 618. The control module 150 may include a bus 612 and a controller 614 which has a buffer 616. The memory module 618 may include a bus 620 and memory arrays 622 of non-volatile storage elements.

During a programming operation, also referred to as a data write operation, the host communicates pages of data in data units to the memory device 196 via the interface 608. For standardization, a data unit referred to as a recording unit may be specified. For example, a recording unit (RU) 602 may include pages 604 and 606. In the Secure Digital (SD) Specification, for instance, the Recording Unit (RU) size for Speed Class 2 and 4 recently increased from 16 KB to 32 KB. For memories with a 16 KB die-page size, this allows pipelined data transfers and writes to the NAND. In particular, write operations can be optimized using an appropriate page programming order. During a write operation, the pages are transferred in multiple segments from the host to the buffer 616 via the interface 608 and the bus 612. When the buffer 616 becomes full, or a certain amount of segments have been received, the controller 614 transfers the segments to the memory module 618 via the bus 620 to the memory arrays 622. When a complete page of data has been received by the memory module 618, it is written to the memory arrays 622.

Figure 6B:
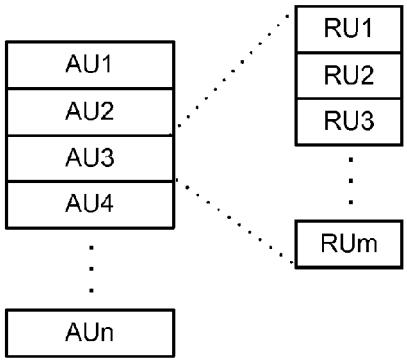
FIG. 6b depicts an example of allocation units in a user area of a non-volatile storage system.

FIG. 6b depicts an example of allocation units in a user area of a non-volatile storage system. In the SD specification, a user area of a memory device which is available to store user data, such as audio and video data, is divided into n units called Allocation Units (AU), e.g., AU1, AU2, AU3, AU4, . . . , AUn. Each memory card has its own fixed AU Size (SAU) and the maximum AU Size is defined depending on the card's capacity. AU SIZE is a 4-bit field which indicates the AU Size, which can be selected in powers of 2, e.g., 16 KB, 32 KB, 64 KB, 128 KB, 256 KB, 512 KB, 1 MB, 2 MB, or 4 MB. The maximum AU size depends on the card capacity. The maximum AU Size is 512 KB for a card capacity of 16-64 MB, 1 MB for a card capacity of 128-256 MB, 2 MB for a card capacity of 512 MB, and 4 MB for a card capacity of 1-32 GB.

Moreover, each AU is divided into m Recording Units (RU), such as RU1, RU2, RU3, . . . , RUn. The RU Size (SRU) should be one or a multiple of the cluster size specified in the SD File System Specification. The number of RUs in an AU (NRU) is calculated from m=NRU=SAU/SRU.

The host should manage data areas with the unit of an AU. Several AUs from AU1 should not be used for real time recording because those may include system information. AV application should start recording from the first complete AU, to which only user data is recorded.

Figure 7A:
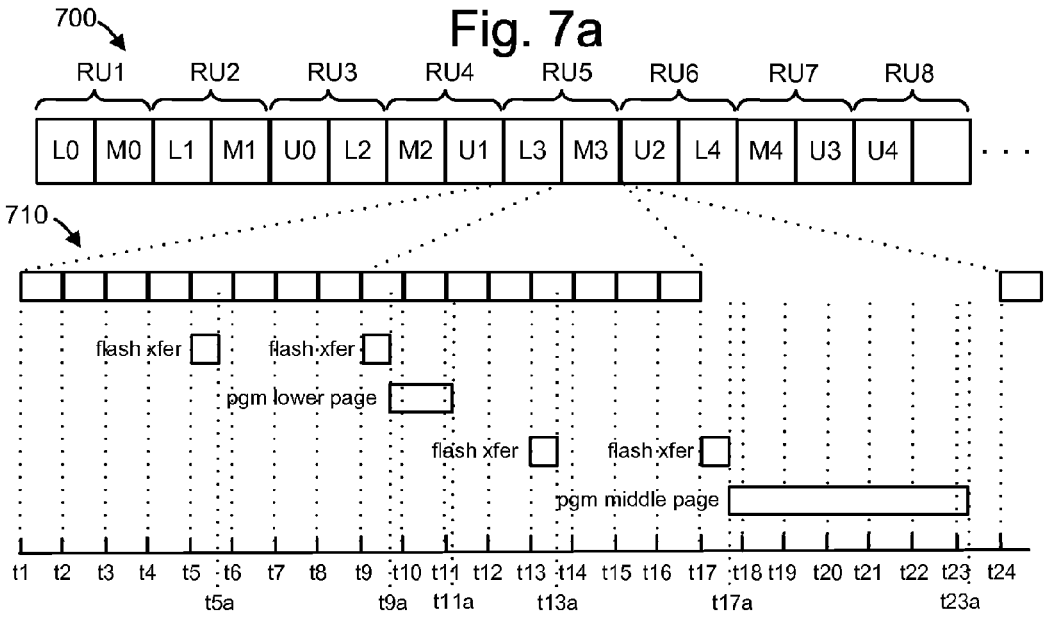
FIG. 7a depicts an example page transmission and programming order.

FIG. 7a depicts an example page transmission and programming order. As mentioned, the host transmits pages of data to the memory device in units of recording units (RUs). The sequence 700 depicts an order of RUs and logical pages, where L denotes a lower page of data, M denotes a middle page of data and U denotes an upper page of data. The number following L, M or U denotes a die page number. For example, L0 denotes a lower page of a die page 0. In one possible implementation, a 32 KB RU size is used, which allows two logical die pages of data to be carried, assuming 16 KB per logical page which extends over a die page (8 KB per logical page per word line in a block and 2 word lines per die page, for a total of 16 KB). In this example, a complete die page, which includes three logical pages, consumes 48 KB.

At the start of the sequence 700, RU1 includes the sequence L0, M0 (lower page of die page 0 followed by middle page of die page 0). RU2 includes the sequence L1, M1 (lower page of die page 1 followed by middle page of die page 1). RU3 includes the sequence U0, L2 (upper page of die page 0 followed by lower page of die page 2). RU4 includes the sequence M2, U1 (middle page of die page 2 followed by upper page of die page 1). RU5 includes the sequence L3, M3 (lower page of die page 3 followed by middle page of die page 3). RU6 includes the sequence U2, L4 (upper page of die page 2 followed by lower page of die page 4). RU7 includes the sequence M4, U3 (middle page of die page 4 followed by upper page of die page 3). The last RU, RU8 includes only one page, namely U4 (upper page of die page 4) in this example of fifteen logical pages. Generally, the sequence continues until all desired data has been transferred from the host to the memory device. A repeating pattern of U, L, M is established, starting with U0.

In further detail, each logical page of data may be transmitted in successive segments from the host to the memory device. In one possible approach, a 16 KB logical page is transferred in eight 2 KB segments. For example, as depicted by sequence 710, logical page L3 is transferred in eight segments in time period t1-9, and logical page M3 is transferred in eight segments in time period t9-17. The first four segments of L3 are transferred between t1-t5. At t5, the buffer 616 of the controller become full, or a transfer to the memory module is otherwise triggered by comparing the amount of segments which have been received to a threshold level. This transfer ("flash xfer") occurs between t5 and some time denoted as t5a. This transfer is internal to the memory device and can occur relatively quickly compared to the transfer from the host to the memory device. However, programming to the memory arrays does not yet occur because an entire logical page has not yet been received.

The next four segments of L3 are transferred between t5-t9. Between t9 and t9a, these four segments are transferred from the buffer 616 to the memory module. Thus, at t9a, an entire logical page of data is available to the memory module so that programming can begin. Generally, a middle page of data takes more time to program than a lower page, since a middle page requires that the storage elements reach a higher threshold voltage than the lower page, and there are more verify levels. Similarly, an upper page of data takes more time to program than a middle page, since an upper page requires that the storage elements reach a higher threshold voltage than the middle page, and there are more verify levels.

In this example, L3 is programmed to the memory arrays between t9a and t11a. During, e.g., the second or third segment of M3, programming of L3 is completed, and the flash memory is idle waiting for the remaining transfers for M3 to complete. Moreover, while L3 is being programmed, and after programming of L3 has been completed, additional segments from M3 are received from the host device by the memory device. Specifically, segments from M3, the next page in the sequence 700, are received concurrent with the programming of L3. When the first four segments of M3 have been transferred from the host to the buffer 616, at t13, these segments are transferred from the buffer 616 to the memory module. This transfer occurs between t13 and t13a. When the next four segments of M3 have been transferred from the host to the buffer 616, at t17, these segments are transferred from the buffer 616 to the memory module between t17 and t17a. M3 is programmed to the memory arrays between t17a and t23a.

The programming time of the middle page M3 is substantially longer than the programming time of the lower page L3. While M3 is being programmed, the host waits to transmit the next RU until it receives a confirmation from the memory device indicating that the current RU, RU5, has been successfully received and written to the memory array. As a result, a significant delay is incurred due to the programming time of the middle page. Once the host receives a confirmation that RU5 has been successfully programmed, at t23a, the host begins transferring the next page and RU, namely U2 of RU6. A first segment of U2 is received at t20. The remaining segments of U2 are not depicted.

Figure 7C:
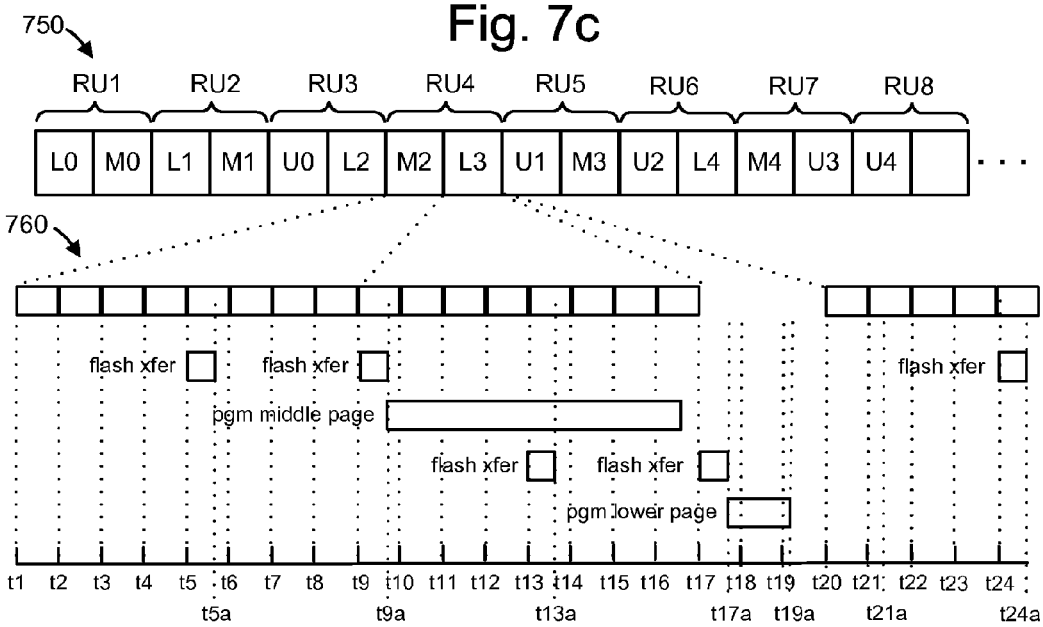
FIG. 7c depicts another example page transmission and programming order which reduces write time.
Figure 7B:
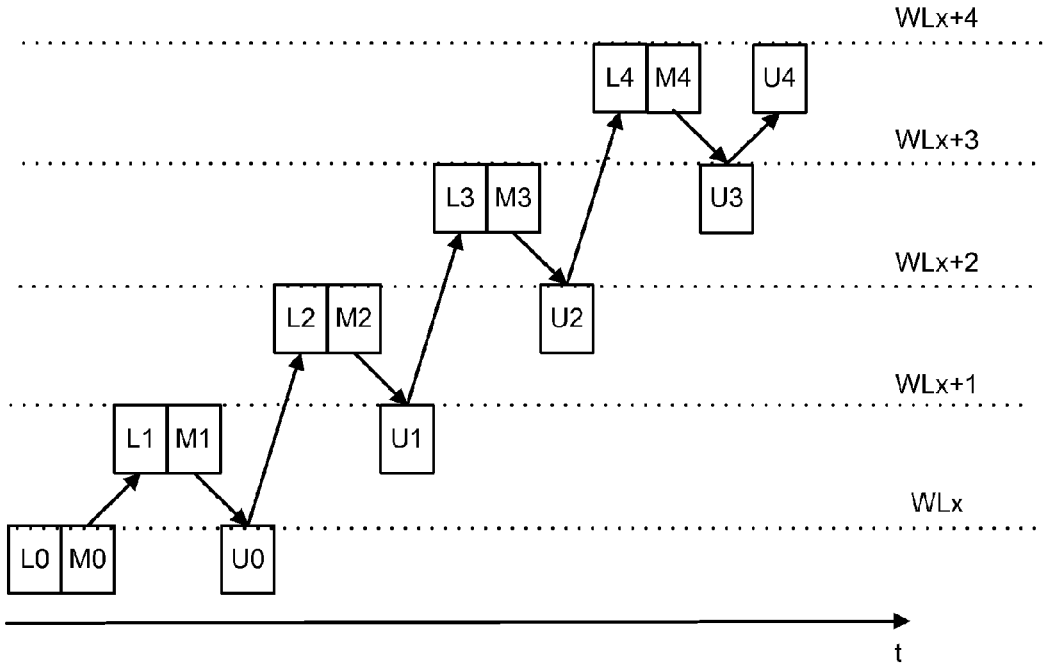

FIG. 7b depicts programming of different word lines based on the transmission and programming order of FIG. 7a. Generally, for a given word line, the logical pages are programmed in the order of lower page, upper page, assuming there are two pages, or lower page, middle page, upper page, assuming there are three pages. However, it is not necessary to program one word line entirely with all logical pages before programming another word line. That is, a back and forth programming technique may be used in which a given word line is programmed with one page of data, after which one or more other word lines are programmed before returning to the given word line to continue programming it with another page of data.

Here, example word lines, in a direction from a source side of a block to a drain side, include WLx, WLx+1, WLx+2, WLx+3 and WLx+4. The logical pages are the same as depicted in the sequence 700, but they are arranged to indicate which word line they are programmed into, and the programming order, based on the time line. Arrows indicate the programming order and transitions between word line. For example, L0 and M0 are programmed on WLx, then L1 and M1 are programmed on WLx+1, then U0 is programmed on WLx, then L2 and M2 are programmed on WLx+2, then U1 is programmed on WLx+1, then L3 and M3 are programmed on WLx+3, then U2 is programmed on WLx+2, then L4 and M4 are programmed on WLx+4, then U3 is programmed on WLx+3, and finally U4 is programmed on WLx+4.

As seen, in the example implementation of FIG. 7a, data is written from the host to the memory device in 32 KB chunks, where the pages are written in pairs in each RU. This sequence can be written as: L-M-L-M-U-L-M-U-L-M-U-L-M-U-U. However, the pair L-M (e.g., L3-M3 in sequence 700) is not optimal because the faster programming page (L) in the RU is provided first. Similarly, the sequence M-U (e.g., M2-U1 in sequence 700) is not optimal because the faster programming page (M) in the RU is provided first.

When pipelining two or more pages together in an RU, it is faster to program the page that is going to take the longest first. This allows the host and flash bus transfer time of the 2nd page to be done in parallel with the slower first page. The page transmission order from the host to the memory device can be modified to achieve this time savings.

FIG. 7c depicts another example page transmission and programming order which reduces write time. As mentioned, in an RU, it is most efficient to program the page with the longer program time first. An example sequence which achieves this result is: L-M-L-M-U-L-M-L-U-M-U-L-M-U-U. A repeating pattern of U, L, M, L, U, M is established, after the initial sequence of L-M-L-M. With this new page sequence it is possible to increase the write performance significantly. A 7% improvement was seen with one scenario when writing with 32 KB RUs.

For a two-level device, an example sequence of RU0 (L0-L1), RU1 (U0-L2), RU2 (U1-L3), RU3 (U2-L4), . . . may be used. A repeating pattern of U-L is established after the initial sequence of L-L.

The time scale in FIG. 7c corresponds to that in FIG. 7a. In the sequence 750, at RU4, for instance, the slower-programming middle page M2 is programmed first, before the faster programming lower page L3. The slower programming middle page M2 is programmed in parallel, concurrently, with the transfer of several segments from L3. In this case, the host transfer time for L3 and the programming time for M2 are similar. Thus, the flash idle time between completion of the programming of M2 and the start of the programming of L3 is smaller compared to completion of the programming of L3 and the start of the programming of M3 in FIG. 7a. Similarly, in FIG. 7c, at RU5, for instance, the slower programming upper page U1 is programmed first, before the faster programming middle page M3.

In further detail, at the start of the sequence 750, RU1 includes the sequence L0, M0 (lower page of die page 0 followed by middle page of die page 0). RU2 includes the sequence L1, M1 (lower page of die page 1 followed by middle page of die page 1). RU3 includes the sequence U0, L2 (upper page of die page 0 followed by lower page of die page 2). RU4 includes the sequence M2, L3 (middle page of die page 2 followed by lower page of die page 3). RU5 includes the sequence U1, M3 (upper page of die page 1 followed by middle page of die page 3). RU6 includes the sequence U2, L4 (upper page of die page 2 followed by lower page of die page 4). RU7 includes the sequence M4, U3 (middle page of die page 4 followed by upper page of die page 3). The last RU, RU8 includes only one page, namely U4 (upper page of die page 4).

Further, as depicted by sequence 760, logical page M2 is transferred in eight segments in time period t1-9, and logical page L3 is transferred in eight segments in time period t9-17. The first four segments of M2 are transferred between t1-t5. A transfer to the memory module occurs from t5-t5a.

The next four segments of M2 are transferred between t5-t9. From t9-t9a, these segments are transferred from the buffer 616 to the memory module. M2 is programmed to the memory arrays between t9a and t11a. While M2 is being programmed, additional segments from L3 are received from the host device by the memory device, concurrent with the programming of M2. When the first four segments of L3 have been transferred from the host to the buffer 616, at t13, these segments are transferred from the buffer 616 to the memory module. This transfer occurs between t13 and t13a. When the next four segments of L3 have been transferred from the host to the buffer 616, at t17, these segments are transferred from the buffer 616 to the memory module between t17 and t17a. L3 is programmed to the memory arrays between t17a and t19a.

Since the programming time of the lower page is substantially shorter than the programming time of the middle page, the overall transfer and programming time is significantly reduced compared to the case of FIG. 7a. The delay in receiving the next RU, RU5 after RU4 has completed programming, is shortened compared to the delay in receiving RU6 after RU5 has completed programming in FIG. 7a.

Once the host receives a confirmation that RU4 has been successfully programmed, at t19a, the host begins transferring the next page and RU, namely U1 of RU5. The first five segments of U1 are received from t20-t24, and the first four segments are transferred from the buffer to the memory module between t24 and t24a. The remaining segments of U1 are not depicted.

Figure 7D:
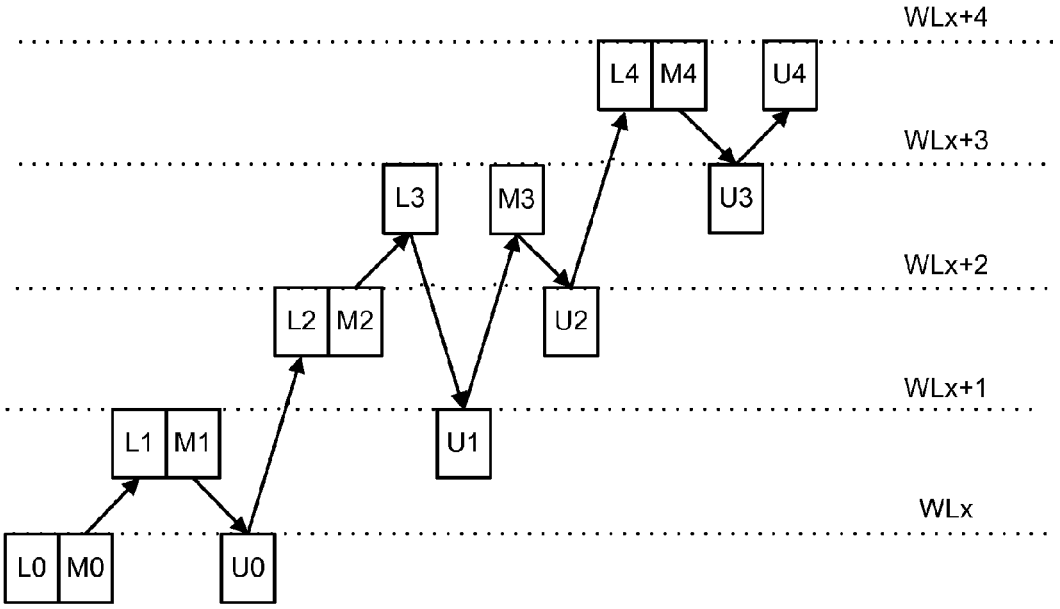
FIG. 7d depicts programming of different word lines based on the transmission and programming order of FIG. 7c.

FIG. 7d depicts programming of different word lines based on the transmission and programming order of FIG. 7c. The logical pages are the same as depicted in the sequence 750, but they are arranged to indicate which word line they are programmed into, and the programming order, based on the time line. Additionally, arrows indicate the programming order and transitions between word line. For example, L0 and M0 are programmed on WLx, then L1 and M1 are programmed on WLx+1, then U0 is programmed on WLx, then L2 and M2 are programmed on WLx+2, then L3 is programmed on WLx+3, then U1 is programmed on WLx+1, then M3 is programmed on WLx+3, then U2 is programmed on WLx+2, then L4 and M4 are programmed on WLx+3, then U3 is programmed on WLx+3, and finally U4 is programmed on WLx+4.

Figure 8A:
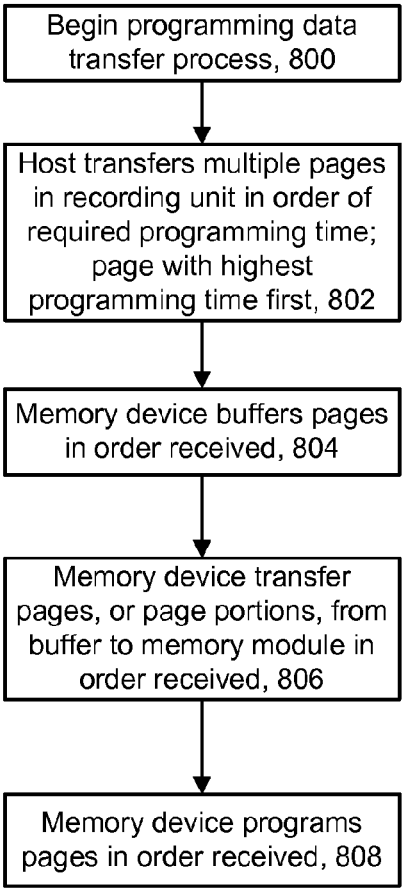
FIG. 8a depicts an overview of a programming process.

FIG. 8a depicts an overview of a programming data transfer process which begins at step 800. At step 802, the host transfers multiple logical pages of data in a recording unit in an order of required programming time, such that the page with the highest programming time is first, a page with a next highest programming time is next, and so forth. Thus the pages are in an order which is reverse to their programming time. Two or more pages are provided in a recording unit. At step 804, the memory device buffers the pages in the order they are received. At step 806, the memory device transfers the pages, or portions of the pages, from the buffer to the memory module. At step 808, the memory device programs the pages in the order they are received from the host.

Figure 8B:
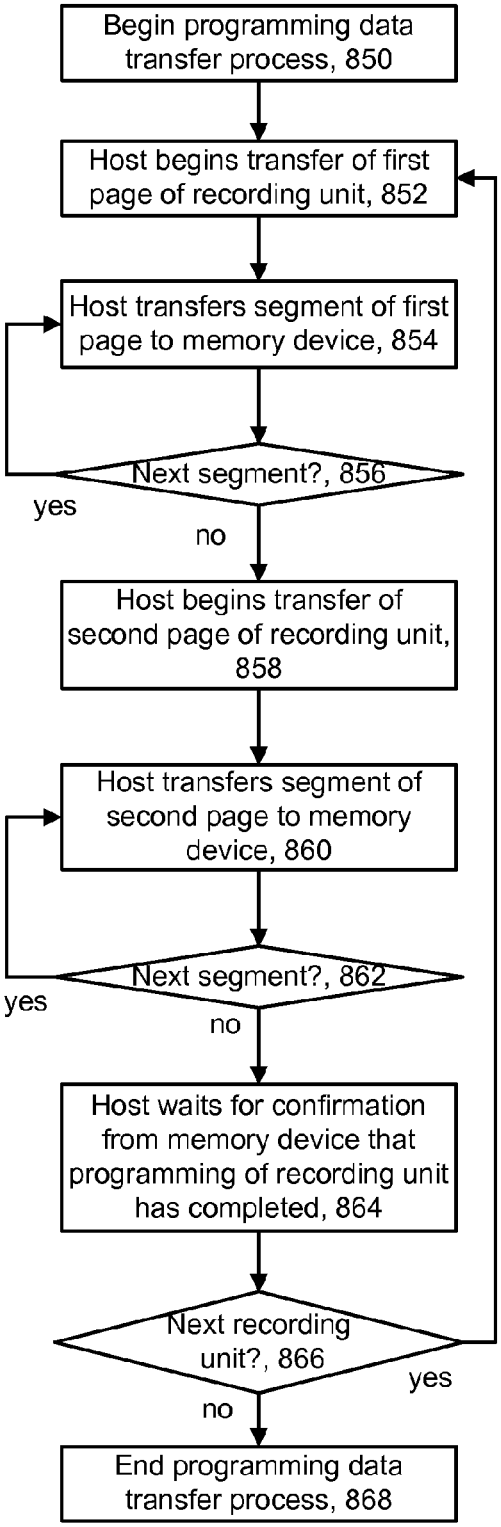
FIG. 8b depicts details of a programming process performed by a host.

FIG. 8b depicts details of a programming data transfer process which begins at step 850. At step 852, the host begins a transfer of a first page of a recording unit to the memory device. To achieve this, at step 854, the host transfers a segment or portion of the first page to the memory device. At decision step 856, if there is a next segment in the page, the host transfers the next segment at step 854. If there is no next segment to transfer, the host begins transfer of the second page of the recording unit at step 858. To achieve this, at step 860, the host transfers a segment or portion of the second page to the memory device. At decision step 862, if there is a next segment in the page, the host transfers the next segment at step 860. If there is no next segment to transfer, the host waits for a confirmation from the memory device that programming of the recording unit has successfully completed.

Once the confirmation is received, a determination is made at decision step 866 as to whether there is a next recording unit to transfer to the memory device. If there is a next recording unit to transfer, the process is repeated starting at step 852. If there is no next recording unit to transfer, the programming data transfer process ends at step 868.

Figure 9:
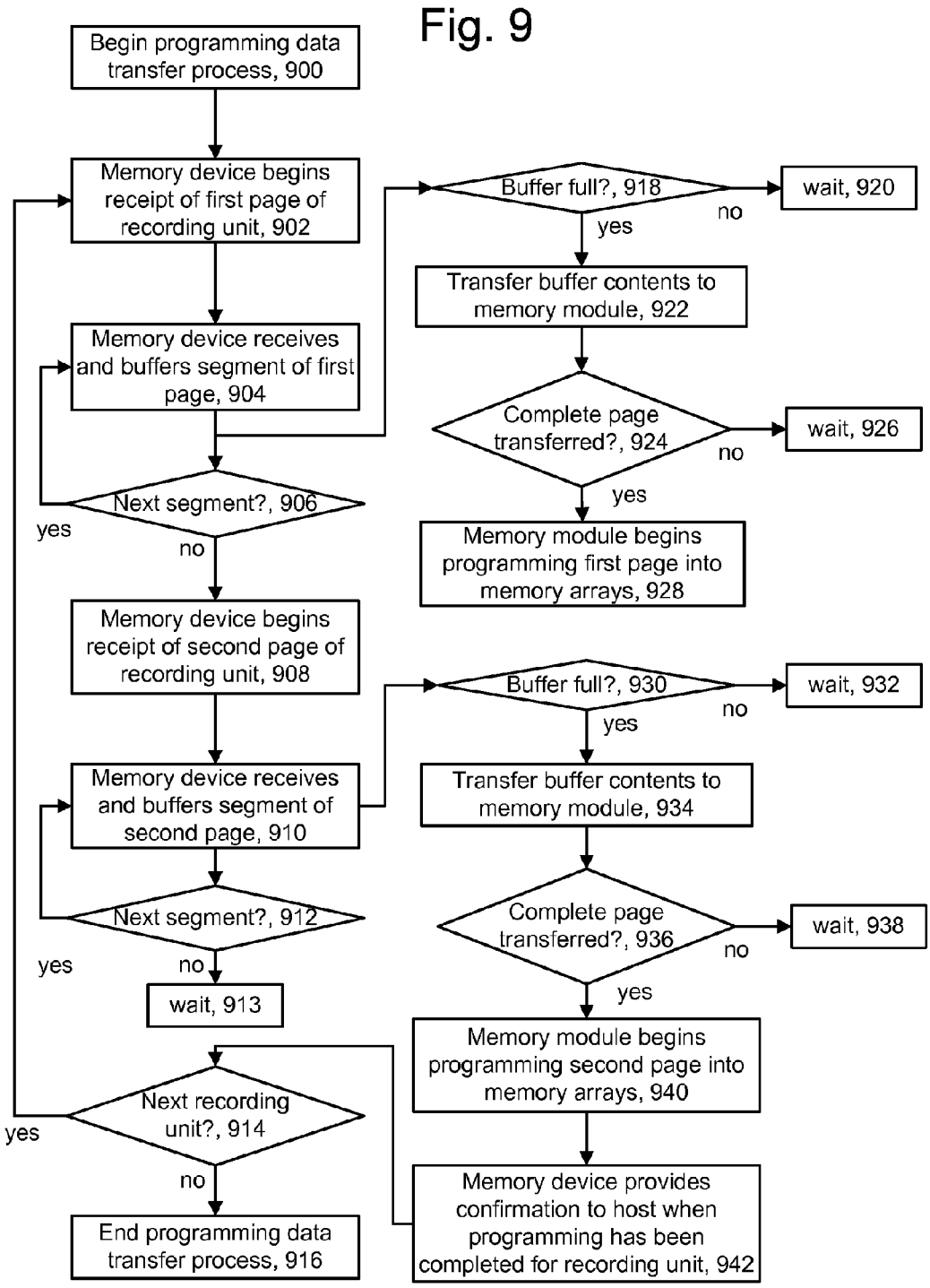
FIG. 9 depicts details of a programming process performed by a memory device.

FIG. 9 depicts details of a programming process performed by a memory device, and is a counterpart to the host process of FIG. 8b. The programming operation begins at step 900. At step 902, the memory device begins receipt of the first page of a recording unit. To achieve this, the memory device receives and buffers a segment of the first page at step 904. From step 904, the process branches in two paths concurrently. In a first path, if there is a next segment, at decision step 906, the segment is received at step 904. If there is no next segment in the page, the memory device begins receipt of a second page of the recording unit at step 908. To achieve this, the memory device receives and buffers a segment of the second page at step 910. From step 910, the process branches again in two paths concurrently. In a first path, if there is a next segment, at decision step 912, the segment is received at step 910. If there is no next segment in the page, a wait is implemented at step 913.

After step 904, in a second path, a determination is made at decision step 918 as to whether a buffer of the memory device is full. If the buffer is not full, a wait is implemented at step 920. If the buffer is full, the buffer contents are transferred to the memory module at step 922. In the examples of FIGS. 7a and 7c, the buffer transfer occurs when one-half a page of data (four segments out of eight) has been received. At decision step 924, if a complete page (e.g., the first page of the recording unit) has been transferred, the memory module begins programming the first page into the memory arrays at step 928. If the complete first page has not yet been transferred to the memory module, at decision step 924, a wait is implemented at step 926.

Similarly, after step 910, in a second path, a determination is made at decision step 930 as to whether the buffer of the memory device is full. If the buffer is not full, a wait is implemented at step 932. If the buffer is full, the buffer contents are transferred to the memory module at step 934. In the examples of FIGS. 7a and 7c, the buffer transfer occurs when one-half a page of data (four segments out of eight) has been received. At decision step 936, if a complete page (e.g., the second page of the recording unit) has been transferred, the memory module begins programming the second page into the memory arrays at step 940. If the complete second page has not yet been transferred to the memory module, at decision step 936, a wait is implemented at step 938.

At step 942, the memory device provides a confirmation message to the host when programming has been completed for the recording unit. At decision step 914, if there is a next recording unit to receive from the host, the process is repeated starting at step 902. If there is no next recording unit to receive, the programming data transfer process ends, at step 916.

In one embodiment of the technology described herein, a method for operating a non-volatile storage system includes: (a) receiving, from a host, a first logical page of data carried in a recording unit of page data, (b) buffering the received first logical page of data in a buffer, (c) transferring the first logical page of data from the buffer to a memory array, and (d) after receiving and buffering the first logical page of data, receiving, from the host, a second logical page of data carried in the recording unit of page data, and buffering the second logical page of data in the buffer. The method further includes: (e) programming the memory array using the first logical page of data which is transferred from the buffer, where the programming is concurrent with the buffering of the received second logical page of data in the buffer, (f) transferring the second logical page of data from the buffer to the memory array, and (g) programming the memory array using the second logical page of data which is transferred from the buffer, where the first logical page of data takes longer to program than the second logical page of data.

In another embodiment, a method for operating a non-volatile storage system includes: (a) receiving, from a host, multiple successive units of page data, one unit at a time, where each unit of page data includes multiple logical pages of data arranged in an order based on their required programming time, highest programming time first, and (b) buffering the logical pages of data of each unit of page data in a buffer, in the order based on their required programming time, highest programming time first. The method further includes: (c) transferring the logical pages of data of each unit of page data from the buffer to a memory array, in the order based on their required programming time, highest programming time first, and (d) programming the memory array using the logical pages of data of each unit of page data transferred from the buffer to a memory array, where the programming is in the order based on their required programming time, highest programming time first. Each unit of page data completes programming before a next unit of page data is received from the host.

In another embodiment, a non-volatile storage system includes a memory array, one or more control circuits in communication with the memory array, and a buffer associated with the one or more control circuits. The one or more control circuits: receive, from a host, a first logical page of data carried in a recording unit of page data, buffer the received first logical page of data in the buffer, and transfer the first logical page of data from the buffer to the memory array. After receiving and buffering the first logical page of data, the one or more control circuits receive, from the host, a second logical page of data carried in the recording unit of page data, and buffer the second logical page of data in the buffer. Furthermore, the one or more control circuits program the memory array using the first logical page of data which is transferred from the buffer, where the programming is concurrent with the buffering of the received second logical page of data in the buffer, and transfer the second logical page of data from the buffer to the memory array. The one or more control circuits also program the memory array using the second logical page of data which is transferred from the buffer, where the first logical page of data takes longer to program than the second logical page of data.

Corresponding methods, systems and computer- or processor-readable storage devices for performing the methods provided herein are provided.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for operating a non-volatile storage system, comprising:

receiving, from a host, a first logical page of data carried in a recording unit of page data;

buffering the received first logical page of data in a buffer;

transferring the first logical page of data from the buffer to a memory array;

after receiving and buffering the first logical page of data, receiving, from the host, a second logical page of data carried in the recording unit of page data, and buffering the second logical page of data in the buffer;

programming the memory array using the first logical page of data which is transferred from the buffer, the programming is concurrent with the buffering of the received second logical page of data in the buffer;

transferring the second logical page of data from the buffer to the memory array; and programming the memory array using the second logical page of data which is transferred from the buffer, the first logical page of data takes longer to program than the second logical page of data, wherein:

the memory array comprises storage elements in successive word lines WLx, WLx+1, WLx+2 and WLx+3, and stores lower, middle and upper pages of data; and the first logical page of data is a middle page of data for WLx+2, and the second logical page of data is a lower page of data for WLx+3; and responsive to completion of the programming of the recording unit of page data, the method further comprises, receiving, from the host, a next recording unit of page data, the next recording unit of page data comprises an upper page of data for WLx followed by a middle page of data for WLx+3.

2. The method of claim 1, wherein:

multiple successive recording units of page data, including the recording unit of page data which carries the first and second logical pages of data, are received, one recording unit at a time, each recording unit of page data includes logical pages of data arranged in an order based on their required programming time, highest programming time first.

3. The method of claim 2, wherein:

each recording unit of page data completes programming before a next recording unit of page data is received from the host.

4. The method of claim 1, wherein:

the memory array stores lower, middle and upper pages of data; and the first logical page of data is the middle page of data, and the second logical page of data is the lower page of data.

5. The method of claim 1, wherein:

the memory array stores lower, middle and upper pages of data; and the first logical page of data is the upper page of data, and the second logical page of data is the middle page of data.

6. The method of claim 1, wherein:

the memory array includes first and second planes, and each plane has multiple blocks of storage elements;

the first logical page of data is a first die page which is concurrently programmed into storage elements in one word line in respective blocks of the first and second planes; and the second logical page of data is a second die page which is concurrently programmed into the storage elements in another word line in the respective blocks of the first and second planes.

7. A method for operating a non-volatile storage system, comprising:

receiving, from a host, a first logical page of data carried in a recording unit of page data;

buffering the received first logical page of data in a buffer;

transferring the first logical page of data from the buffer to a memory array;

after receiving and buffering the first logical page of data, receiving, from the host, a second logical page of data carried in the recording unit of page data, and buffering the second logical page of data in the buffer;

programming the memory array using the first logical page of data which is transferred from the buffer, the programming is concurrent with the buffering of the received second logical page of data in the buffer;

transferring the second logical page of data from the buffer to the memory array; and programming the memory array using the second logical page of data which is transferred from the buffer, the first logical page of data takes longer to program than the second logical page of data, wherein:

the first logical page of data is received in multiple successive segments;

the first logical page of data is transferred from the buffer to the memory array in multiple sets of the segments at different times;

programming of the memory array using the first logical page of data does not start until all of the segments of the first logical page have been transferred from the buffer to the memory array;

the second logical page of data is received in multiple successive segments; and the second logical page of data is transferred from the buffer to the memory array in multiple sets of the segments of the second logical page of data at different times; and programming of the memory array using the second logical page of data does not start until all of the segments of the second logical page have been transferred from the buffer to the memory array.

8. A method for operating a non-volatile storage system, comprising:

receiving, from a host, multiple successive units of page data, one unit at a time, each unit of page data includes multiple logical pages of data arranged in an order based on their required programming time, highest programming time first;

buffering the logical pages of data of each unit of page data in a buffer, in the order based on their required programming time, highest programming time first;

transferring the logical pages of data of each unit of page data from the buffer to a memory array, in the order based on their required programming time, highest programming time first; and programming the memory array using the logical pages of data of each unit of page data transferred from the buffer to a memory array, the programming is in the order based on their required programming time, highest programming time first, each unit of page data completes programming before a next unit of page data is received from the host, wherein for each unit of page data, a logical page of data with the highest programming time is programmed while a logical page of data with a lower programming time is being received and buffered.

9. The method of claim 8, wherein:

each unit of page data completes programming before a next unit of page data is received from the host.

10. The method of claim 8, wherein:

the memory array stores lower, middle and upper pages of data; and the multiple successive units of page data include a unit of page data having a middle page of data followed by a lower page of data, followed by a unit of page data having an upper page of data followed by a middle page of data.

11. The method of claim 8, wherein:

each unit of page data has only two logical pages of data.

12. A non-volatile storage system, comprising:

a memory array;

one or more control circuits in communication with the memory array; and a buffer associated with the one or more control circuits;

the one or more control circuits:

receive, from a host, a first logical page of data carried in a recording unit of page data;

buffer the received first logical page of data in the buffer;

transfer the first logical page of data from the buffer to the memory array;

after receiving and buffering the first logical page of data, receive, from the host, a second logical page of data carried in the recording unit of page data, and buffer the second logical page of data in the buffer;

program the memory array using the first logical page of data which is transferred from the buffer, the programming is concurrent with the buffering of the received second logical page of data in the buffer;

transfer the second logical page of data from the buffer to the memory array; and program the memory array using the second logical page of data which is transferred from the buffer, the first logical page of data takes longer to program than the second logical page of data, wherein the recording unit of page data is received with multiple successive recording units of page data, one recording unit at a time, each recording unit of page data includes logical pages of data arranged in an order based on their required programming time, highest programming time first.

13. The non-volatile storage system of claim 12, wherein:

each recording unit of page data completes programming before a next recording unit of page data is received from the host.

14. The non-volatile storage system of claim 12, wherein:

the memory array stores lower, middle and upper pages of data; and the first logical page of data is the middle page of data, and the second logical page of data is the lower page of data.

15. The non-volatile storage system of claim 12, wherein:

the memory array stores lower, middle and upper pages of data; and the first logical page of data is the upper page of data, and the second logical page of data is the middle page of data.

16. The non-volatile storage system of claim 12, wherein:

the memory array, the one or more control circuits and the buffer are provided in a memory card, and the host is external to the memory card.

17. A non-volatile storage system, comprising:

a memory array;

one or more control circuits in communication with the memory array; and a buffer associated with the one or more control circuits;

the one or more control circuits:

receive, from a host, a first logical page of data carried in a recording unit of page data;

buffer the received first logical page of data in the buffer;

transfer the first logical page of data from the buffer to the memory array;

after receiving and buffering the first logical page of data, receive, from the host, a second logical page of data carried in the recording unit of page data, and buffer the second logical page of data in the buffer;

program the memory array using the first logical page of data which is transferred from the buffer, the programming is concurrent with the buffering of the received second logical page of data in the buffer;

transfer the second logical page of data from the buffer to the memory array; and program the memory array using the second logical page of data which is transferred from the buffer, the first logical page of data takes longer to program than the second logical page of data, wherein:

the memory array includes first and second planes, and each plane has multiple blocks of storage elements;

the first logical page of data is a first die page which is concurrently programmed into storage elements in an nth word line in respective blocks of the first and second planes; and the second logical page of data is a second die page which is concurrently programmed into the storage elements in the nth word line in the respective blocks of the first and second planes.

*18. The method of claim 1, wherein: the storage elements are arranged in a three-dimensional memory structure.*

*19. The method of claim 7, wherein: the non-volatile storage system comprises storage elements which are arranged in a three-dimensional memory structure.*

*20. The method of claim 8, wherein: the non-volatile storage system comprises storage elements which are arranged in a three-dimensional memory structure.*

*21. The non-volatile storage system of claim 12, wherein: the memory array comprises storage elements arranged in a three-dimensional memory structure.*

*22. The non-volatile storage system of claim 17, wherein: the memory array comprises storage elements arranged in a three-dimensional memory structure.*

* * * * *